(12) United States Patent
Nakamura

(10) Patent No.: US 6,624,520 B1
(45) Date of Patent: Sep. 23, 2003

(54) TAPE CARRIER, MANUFACTURING METHOD OF TAPE CARRIER AND PACKAGE MANUFACTURING METHOD

(75) Inventor: Nakae Nakamura, Fukuyama (JP)

(73) Assignee: Sharp Kabushiki Kaisha (JP)

( * ) Notice: Subject to any disclaimer, the term of this patent is extended or adjusted under 35 U.S.C. 154(b) by 218 days.

(21) Appl. No.: 09/716,432

(22) Filed: Nov. 21, 2000

(30) Foreign Application Priority Data

Nov. 25, 1999 (JP) ............................................. 11-334931

(51) Int. Cl.[7] .............................................. H01L 23/48
(52) U.S. Cl. ......................................... 257/778; 257/737
(58) Field of Search ................................ 257/778, 737

(56) References Cited

U.S. PATENT DOCUMENTS

| | | | | |
|---|---|---|---|---|
| 6,154,366 A | * | 11/2000 | Ma et al. | 361/704 |
| 6,274,405 B1 | * | 8/2001 | Hashimoto | 438/110 |
| 6,313,526 B1 | * | 11/2001 | Nakamura | 257/706 |
| 6,403,463 B1 | * | 6/2002 | Suyama | 438/622 |
| 6,423,570 B1 | * | 7/2002 | Ma et al. | 438/106 |

FOREIGN PATENT DOCUMENTS

| KR | 1993-886 | 1/1991 |
|---|---|---|
| KR | 0142048 | 4/1996 |

OTHER PUBLICATIONS

Korean Office Action mailed Jun. 28, 2002 and English translation thereof.

* cited by examiner

*Primary Examiner*—Richard Elms
*Assistant Examiner*—Christian D. Wilson
(74) *Attorney, Agent, or Firm*—Nixon & Vanderhye PC (57) ABSTRACT

A tape carrier in accordance with the present invention is arranged so that it entirely covers one of surfaces of a semiconductor element, and has a metal pattern which is connected to a connection terminal of the semiconductor element an external device. In this arrangement, the metal pattern is exposed to the surface opposite to the surface to which the semiconductor element is connected. With this arrangement, it is possible to connect a circuit element including a semiconductor element to the wiring pattern exposed to the surface on the side opposite to the surface to which the semiconductor element is connected, of the upper and lower two surfaces that the tape carrier has. Moreover, since the metal pattern is exposed to the surface on the side opposite to the surface to which the semiconductor element is connected, a circuit element can be connected also to this surface, and a package circuit is constituted by using both of the surfaces of the tape carrier. Therefore, as compared with the conventional structure, it is possible to miniaturize the package, and also to cut costs.

20 Claims, 11 Drawing Sheets

TAPE CARRIER, MANUFACTURING METHOD OF TAPE CARRIER AND PACKAGE MANUFACTURING METHOD

FIELD OF THE INVENTION

The present invention relates to a tape carrier called a COF (Chip On Film) (hereinafter, referred to simply as COF) in which a semiconductor element is connected to and assembled on a flexible wiring substrate, and also concerns a manufacturing method for such a tape carrier and a manufacturing method for a package.

BACKGROUND OF THE INVENTION

In a TCP (tape carrier package) in which semiconductor elements are continuously formed on a flexible wiring substrate, a through hole (hereinafter, referred to simply as a device hole) is preliminarily formed in a tape carrier member at a portion corresponding to a semiconductor element, and through this hole, a tip portion of a wiring pattern, which is referred to as an inner lead, and sticks out in a cantilever fashion, is connected to a semiconductor element electrode. The TCP has been widely used, for example, when a semiconductor element for driving a liquid crystal display is connected to the display panel.

In recent years, in the field of small and middle size liquid crystal panel devices, there have been increasing demands for both miniaturization of modules and large scale of liquid crystal panels. In order to meet these demands, a so-called packaging area, that is, a joining area between the liquid crystal panel and the TCP, needs to be reduced. However, in the case when the liquid crystal panel and the TCP are simply connected, a portion of the TCP other than the output terminal portion comes to protrude from the glass edge of the liquid crystal panel. When the amount of this protruding portion is large, the module becomes bulky, resulting in a reduction in the ratio of the panel display area to the module area. Therefore, in an attempt to reduce the amount of the protruding portion, a packaging method has come to be used in which the protruding portion of the TCP from the end of the liquid crystal panel is bent over to the rear face of the liquid crystal panel via the glass side face, as illustrated in FIG. 5.

Figure 5:
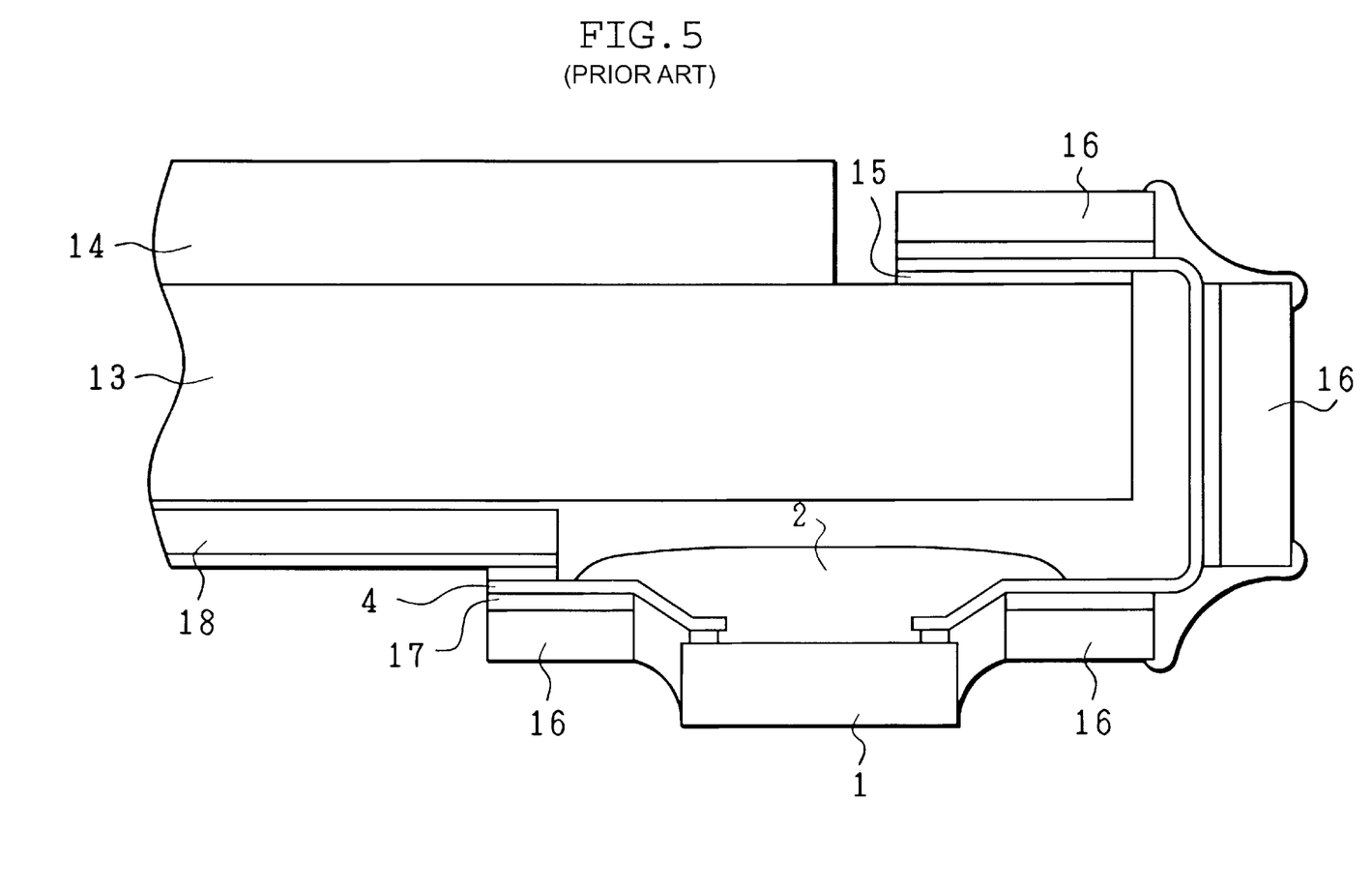
FIG. 5 is an explanatory drawing that shows a state in which a conventional package having a bent structure is assembled on a liquid crystal panel.

Referring to FIG. 5, an explanation will be briefly given of the packaging sequence of the structure in which the TCP is bent over. In a liquid crystal panel constituted by an element side glass plate 13 and an opposing side glass plate 14, first, a terminal portion of the element side glass plate 13 and a film 16 constituting the TCP are joined to each other through an AC 15 (anisotropic conductive bonding agent), etc. In this case, since the film 16 other than the output terminal portion comes to protrude from the end of the element side glass plate 13, the protruding portion is bent over to the rear face via the side face of the element side glass plate 13. Next, a wiring pattern 4 on the TCP side, bent over to the rear face side of the element side glass plate 13, is connected to a connecting terminal section of a power-supply main substrate 18 with solder and a connector, etc. An IC chip 1 is placed on the film 16, and fixed thereon by resin 2, and the wiring pattern 4 and the film 16 have been bonded to each other with a bonding agent 17.

Figure 6A:
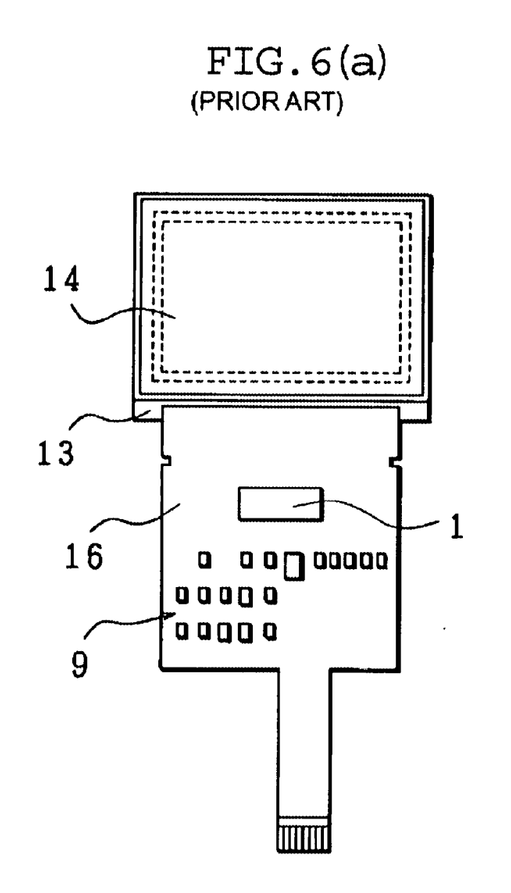
FIGS. 6(a) to (c) are explanatory drawing that show a state in which a conventional package of the part packaging type is assembled on a liquid crystal panel.
Figure 6B:
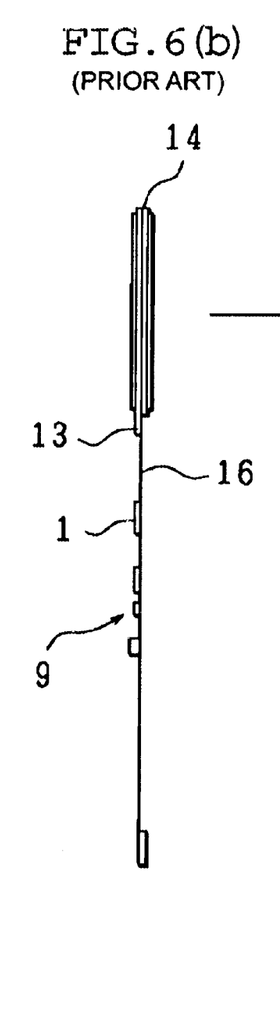
Figure 6C:
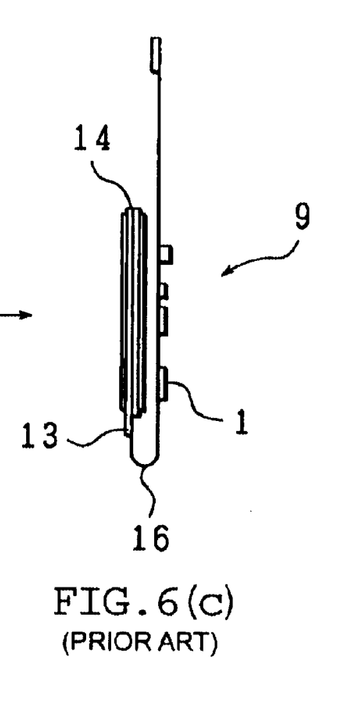

Here, as illustrated in FIGS. 6(a)–(c), in some arrangements, in order to miniaturize the power-supply main substrate 18, a part-placing area 9 is placed between the IC chip 1 and an input terminal section, and a resistor, a capacitor, etc. are placed on the TCP side of the power supply main substrate 18. FIG. 6(a) is a plan view of the liquid crystal panel showing a state of the TCP and the liquid crystal panel connected to each other, and FIGS. 6(b) and 6(c) are side views of the liquid crystal panel showing states before and after the bending process of the TCP.

Here, in the field of large-size liquid crystal panel devices, a number of TCPs need to be assembled in longitudinal and lateral directions of the liquid crystal panel so as to drive the liquid crystal panel. In this case, the TCP needs to be arranged not only to be simply bent over, but also to have a reduced stress that is exerted when bent over. Therefore, TCPs of another type have come to be used in which, illustrated in FIG. 5, cutout sections are preliminarily formed in the tape carrier member at portions corresponding to bending sections so that a stress exerted at the time of the bending process is reduced, and a cover coat is placed so that disconnection of the pattern at the bending portions is prevented.

Figure 7:
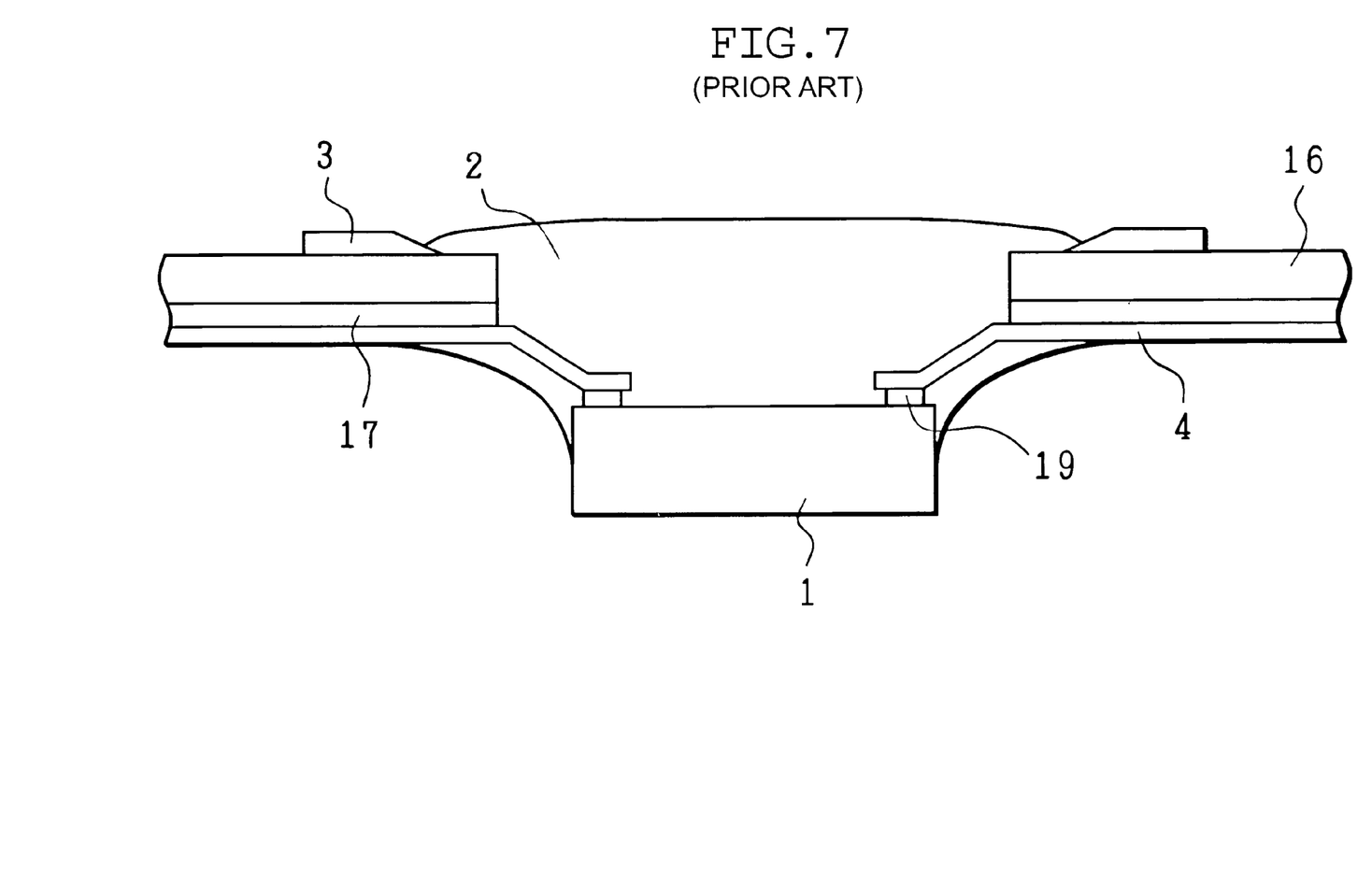
FIG. 7 is an explanatory drawing that shows a cross-sectional construction of a conventional package that has been assembled in a face-down method.
Figure 8:
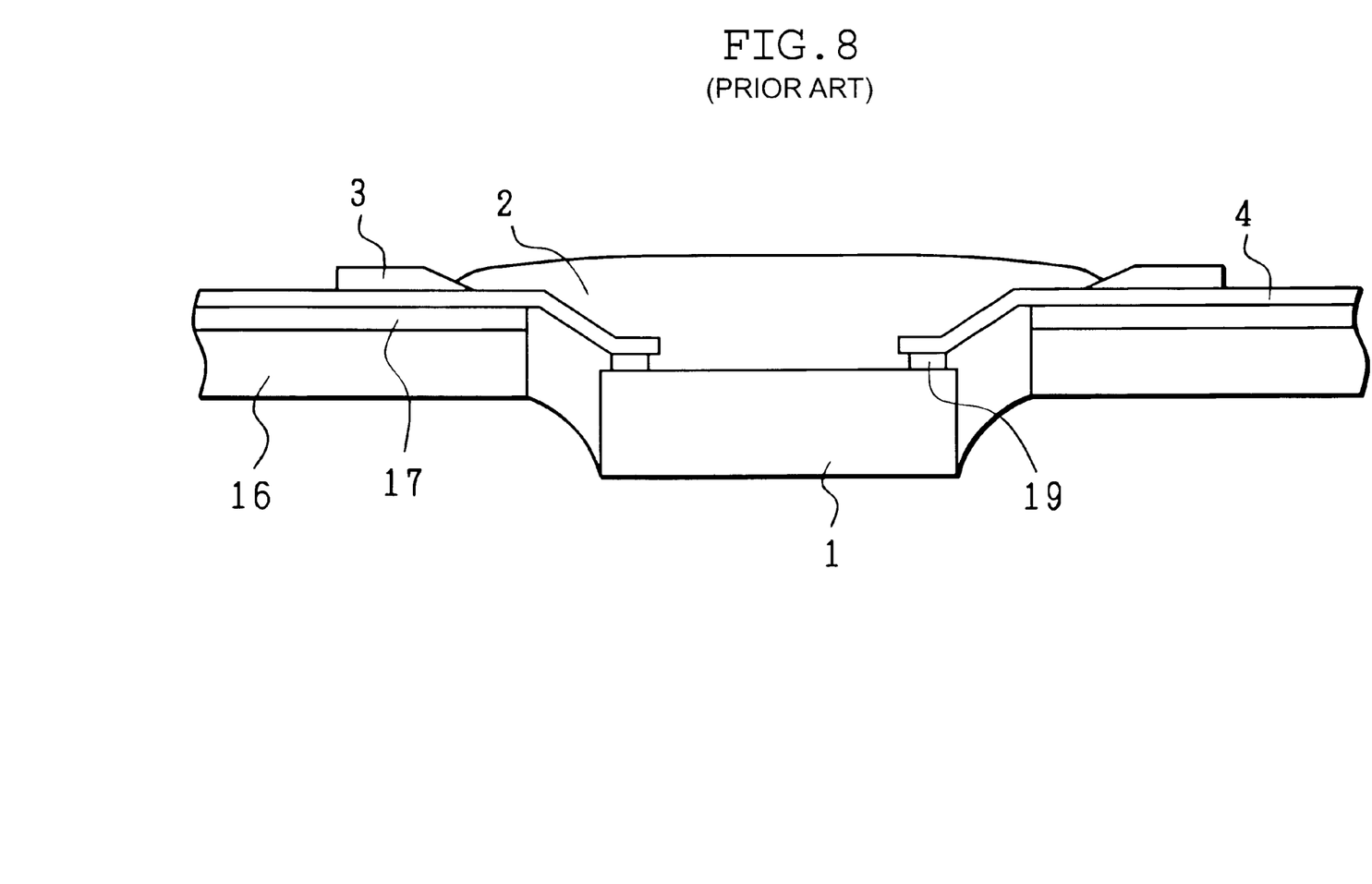
FIG. 8 is an explanatory drawing that shows a cross-sectional construction of a conventional package that has been assembled in a face-up method.

The TCPs of this type make it possible to reduce the amount of the protruding portion of the TCP; however, the increased thickness of the bent over TCP results in an increase in the thickness of the liquid crystal module. Therefore, in the case when a thinner product is desired, another TCP structure which forms a flat packaging on the liquid crystal panel by using either the face-down packaging system shown FIG. 7 or the face-up packaging system shown in FIG. 8 is adopted. In FIGS. 7 and 8, a cover coat 3 and a wiring pattern 4 are stacked on the film 16, and an IC chip 1 and a wiring pattern 4 are connected by a connection lead 19.

In this manner, in the case when the flat TCP structure is formed on the liquid crystal panel, the thickness of the package is reduced by controlling the thickness of the IC chip 1, the forming depth of the connection lead 19 and the thickness of resin 2 so as to reduce the thickness of the package. Moreover, the package design is simply miniaturized so that the packaging area is reduced. However, problems such as a reduction in the strength against break arise, thereby giving a limitation to the attempt to reduce the IC chip 1. Thus, there have been demands for a thinner package which is bendable.

The COF has been developed to meet such demands by providing low cost products in which the functions of the TCP are limited. The COF is made of a thin film that is a thin film-shaped tape carrier material having a thickness of approximately 40 μm. The COF has no device holes, and its wiring pattern to be joined to a semiconductor element electrode is lined with the tape carrier material.

Here, an explanation will be briefly given of processes for forming a generally used COF tape carrier.

First, a transport-use carrier tape is bonded to a film material with metal foil that has a two-layer structure formed into a thin film. Next, this is subjected to various processes, such as a resist-coating process, an exposing process, a developing process, an etching process and a resist-removing process, so that a pattern is formed on the metal foil. Further, among portions of the exposed metal foil pattern, resist is coated onto those exposed portions that are not connected to semiconductor element electrodes, etc. so as to be insulated. Lastly, the electrode connection sections of the metal foil pattern are subjected to a plating process so as to stabilize the connection between the metal foil pattern and the semiconductor element electrodes, etc.

As compared with the TCP, the features of the COF are that the formation process of the tape carrier is simple and that the material cost is inexpensive. Moreover, with respect to the COF, since its tape carrier material is inherently flexible, it is bendable at any portion except the peripheral portion of the assembled semiconductor element. Moreover, in the case of the application of a reinforcing film that adheres to the rear face of the tape carrier, it is possible to adopt a ultra-thin film having a thickness of 25 μm.

Figure 9:
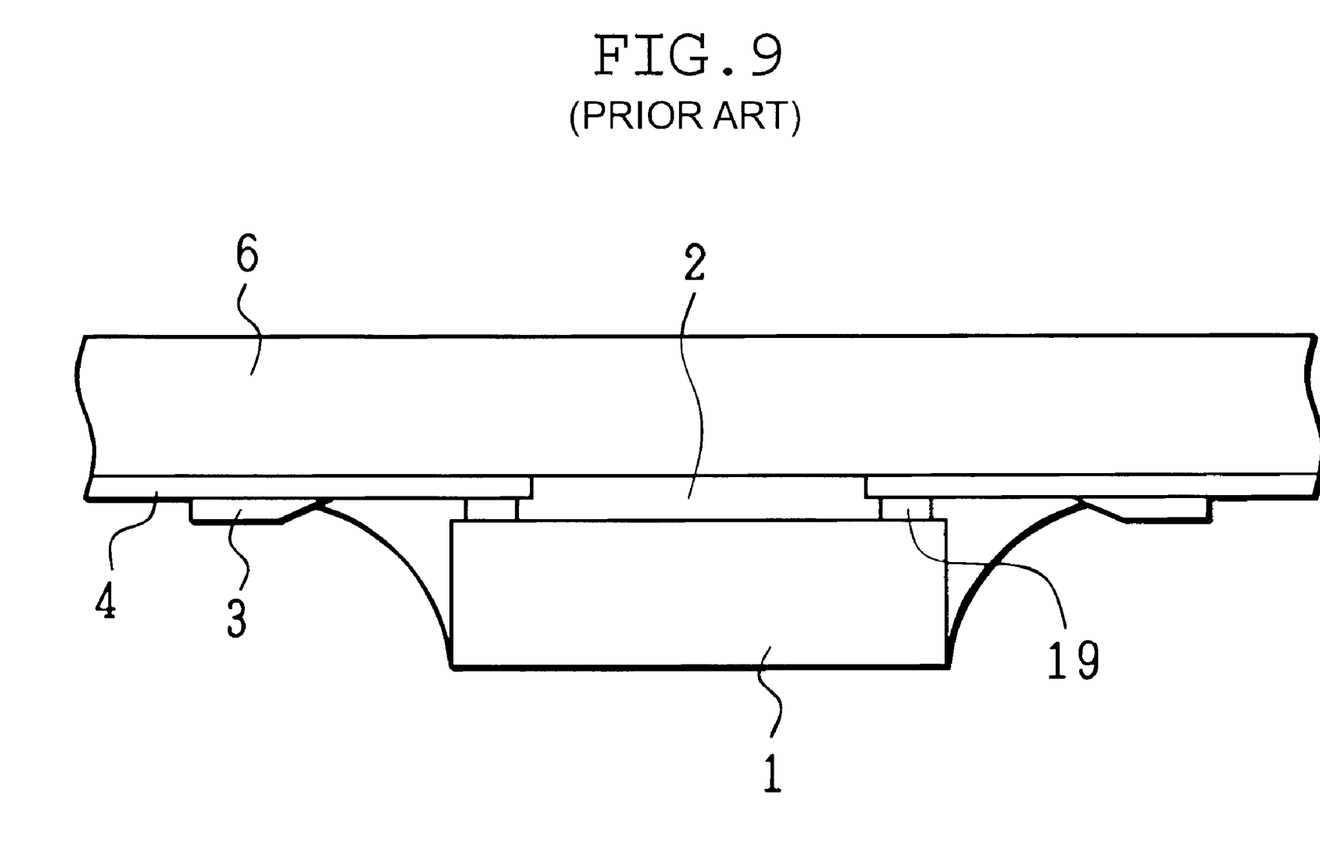
FIG. 9 is an explanatory drawing that shows a cross-sectional construction of a conventional COF package that has been assembled in a face-down method.

Here, as compared with the TCP, the disadvantage of the COF is that, since the COF does not have a device hole on the film, the assembling direction of the semiconductor element is limited to the face-down direction as shown in FIG. 9. Therefore, the package design needs to be carried out on one plane, and in order to reduce the package area so as to cut costs and miniaturize the assembling area by reducing the tape carrier material, only the possible method is to improve the assembling efficiency by narrowing the wiring pattern and reducing the area of the semiconductor element. However, the improvement of the assembling efficiency depending on this method has reached a limit in terms of designing; therefore, the minimum package area required is inevitably determined, and the resulting problem is that it is no longer possible to reduce the package area to a great extent.

Moreover, even when a small package is achieved by package designing on one plane, the following problems might arise.
(1) When a part-placing area is placed on a small package, the intervals between the packaged parts become narrower, making it difficult to revise the parts, that is, making it difficult to repair or exchange the parts.
(2) In the case of a small package, since the joining area between the liquid crystal panel and the package becomes smaller, the joined portion is susceptible to peeling due to a stress occurring at the time of the package bending process, resulting in a disconnection. In order to solve the problem (2), one solution is to make the thin film further thinner so as to reduce the stress; however, to make the film thinner encounters a certain technical limitation. Moreover, when the film becomes too thin, the package tends to lose its flexibility, resulting in difficulties in handling and transporting, and the subsequent need for another reinforcing carrier tape that causes high costs.

These problems become more serious as the performances required for the package become higher along with demands for large-size packages for achieving multiple outputs and for finer pitches of wires.

The present invention has been devised so as to solve the above-mentioned problems with conventional methods, and its objective is to provide a tape carrier and a manufacturing method for a package and such a tape carrier, which can achieve miniaturization and cost reduction by placing a semiconductor element and a circuit part on both of the surfaces and which can also improve connection stability to an external device by minimizing a stress exerted at the time of the bending process.

SUMMARY OF THE INVENTION

In order to solve the above-mentioned problems, a tape carrier in accordance with the present invention, which entirely covers one of the surfaces of a semiconductor element, and is provided with a metal pattern which is connected to a connection terminal of the semiconductor element and an external device, is characterized in that the metal pattern is exposed to the surface opposite to the surface to which the semiconductor element is connected.

In accordance with the present invention, it is possible to connect a circuit element including a semiconductor element to the wiring pattern exposed to the surface on the side opposite to the surface to which the semiconductor element is connected, of the upper and lower two surfaces that the tape carrier has.

In the case of a conventional tape carrier which does not have a device hole and which entirely covers one of the surfaces of a semiconductor element, the surface on the side opposite to the surface to which the semiconductor element is connected is covered with a base film, and the metal pattern that is connected to inner and outer devices is not exposed. As compared with a tape carrier having a device hole, the tape carrier of this type has a disadvantage in that the assembling direction of the semiconductor element is limited to the face-down direction, although it has advantages such as low manufacturing costs. Therefore, the entire package circuit has to be formed on one surface of the tape carrier, resulting in limitation to the miniaturization of the tape carrier and the package.

In accordance with the above-mentioned invention, the metal pattern is exposed to the surface on the side opposite to the surface to which the semiconductor element is connected; therefore, a circuit element can be connected also to this surface, and a package circuit is constituted by using both of the surfaces of the tape carrier. With this arrangement, as compared with the conventional structure, it is possible to miniaturize the package, and also to cut costs. Moreover, with respect to a package having a predetermined size, it is possible to provide more margins in designing as compared with the conventional arrangement; thus, it becomes possible to widen the intervals between the parts, and consequently to revise the parts more easily.

Moreover, since the tape carrier of the present invention has no base film, the stress exerted at the time of bending of the tape carrier can be minimized by a value corresponding to the stress exerted due to the base film. Thus, in the case when a package is connected to an external device in a bent state, that is, for example, in the case when the package is connected to connection terminals of a liquid crystal device in a bent state, it is possible to reduce the occurrence of disconnection due to a bending stress exerted on the package. Since the bending stress of the package is small, it is possible to minimize the joining area to the connection terminals of a liquid crystal panel, etc., and consequently to further miniaturize the package.

For a fuller understanding of the nature and advantages of the invention, reference should be made to the ensuing detailed description taken in conjunction with the accompanying drawings.

DESCRIPTION OF THE EMBODIMENTS

Embodiment 1

Referring to Figures, the following description will discuss one embodiment of the present invention.

FIGS. 2(a) to 2(f) are flow charts of processes that are carried out so as to manufacture a COF (a tape carrier and a package) of the present invention, and cross-sectional views of the COF in the respective processes.

Figure 2A:
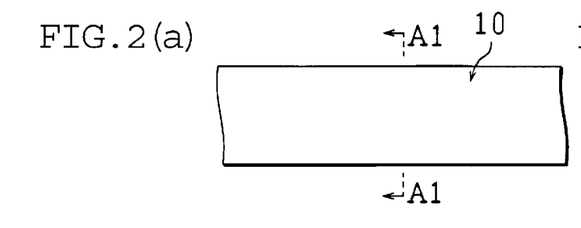
FIGS. 2(a) to 2(f) are explanatory drawings that shows package manufacturing processes in accordance with the embodiment of the present invention.

First, as illustrated in FIG. 2(a), both of the faces of metal foil 10 that is a material are subjected to a plating process using tin or gold. The metal foil 10 is elongated copper foil having a thickness of any one of 5 $\mu$m, 8 $\mu$m, 12 $\mu$m, 15 $\mu$m, 18 $\mu$m and 35 $\mu$m that are set as typical thickness specifications.

By using one having a thickness of 5 to 35 $\mu$m as the metal foil 10, the COF of the present invention is made sufficient thin while maintaining its flexibility and to have a structure that is easily bent. For this reason, it is possible to minimize a stress exerted on the COF when connected to an external device in its bent state. With this arrangement, it is possible to improve joining stability of the COF to an external device and to reduce the occurrence of disconnection. The metal foil 10 thicker than 35 $\mu$m is disadvantageous in miniaturizing the package, and the metal foil 10 of less than 5 $\mu$m is hard to be manufactured. Here, the plating process in the present operation may be omitted, and a plating process may be carried out at the time of a pattern forming process on a later stage, shown in FIG. 2(c).

Figure 2B:
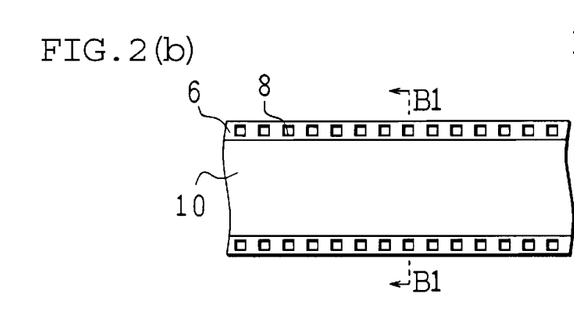

Next, as illustrated in FIG. 2(b), after the metal foil 10 has been affixed to an elongated thin film 6 (base film), a sprocket hole 8, used for transportation and positioning, is formed therein. The thin film 6 is a polyimide-based insulating film (surface resistivity: not less than $10^9$ [$\Phi/m^2$]) having a thickness of 40 $\mu$m. With respect to a method for joining the metal foil 10 to the thin film 6, in addition to a bonding agent, vapor deposition and press-bonding may be properly combined and used. Since the thin film 6 is separated in a post process, the bonding strength between the metal foil 10 and the thin film 6 is preferably set so as not to be too strong and also so as to be easily separated. The preferable peel strength is set in the range of 50 to 200 g/cm² in the strength test in which the thin film 6 joined to the metal foil 10 is pulled and separated therefrom in a direction perpendicular to the joined face.

Figure 2C:
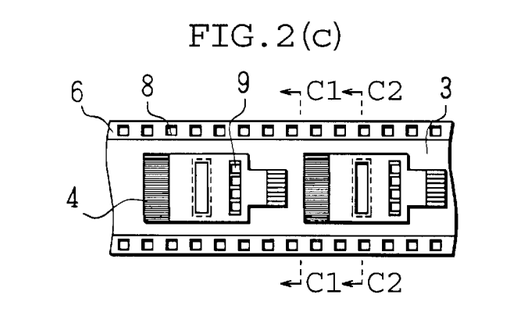

As illustrated in FIG. 2(c), the metal foil 10 is subjected to processes such as resist application, exposure, development, etching and resist separation so that a thin film 6 with a wiring pattern 4 (metal pattern) formed thereon is obtained. Moreover, for protection against electricity and external stress, among areas on the thin-film 6 bearing the wiring pattern 4, those areas other than a packaging section of the IC chip 1, a part packaging area 9 and a connecting section are covered with a cover coat 3 (protective layer) made of a polyimide resin.

Figure 2D:
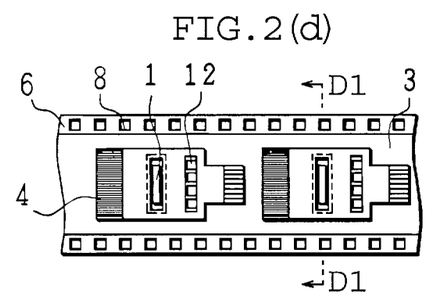

Next, as illustrated in FIG. 2(d), after the wiring pattern 4 and the electrode terminal of the IC chip 1 have been connected through bumps of the face-down method, this is sealed and fixed with resin 2. Moreover, parts 12 such as resistors and capacitors are packaged on the part-placing area 9 on demand. Here, an inspection process may be carried out after the present process. In the case when a material having a high electric resistivity (surface resistivity: not less than $10^9$ [$\Phi/m^2$]) is adopted as the thin film 6 as in the case of the present embodiment, the conductivity of the thin film 6 becomes small so as to be negligible in comparison with the wiring pattern 4. Therefore, even in the case when an inspection process for confirming the electrical and mechanical continuities between the wiring pattern 4 and the IC chip 1, etc., and for confirming the insulating property between the independent wiring patterns 4 are placed before the separation of the thin film 6, it is possible to avoid erroneous judgments due to current leakage of the thin film 6, and consequently to carry out the inspection positively and more easily.

Figure 2E:
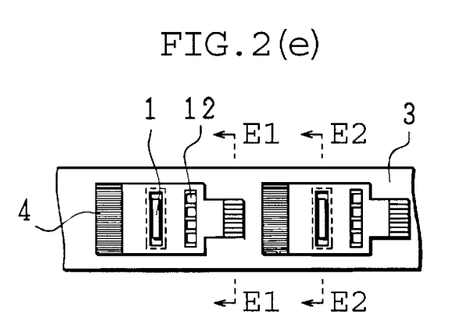

Next, as illustrated in FIG. 2(e), the thin film 6 is separated so that the wiring pattern 4 of the metal foil 10 is exposed. Thus, only the cover coat 3 is placed on the externally connecting section used for external connections on the wiring pattern 4. Here, a material that can be selectively etched separately from the wiring pattern 4 and the cover coat 3 may be used as the thin film 6, and only the thin film 6 may be removed by etching the thin film 6 in the present process.

Figure 2F:
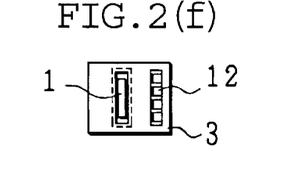

Next, as illustrated in FIG. 2(f), the COF is subjected to a punch-out process (dividing process) to be shaped into a desired size, and packaged; thus, the COF has final outside dimensions. In the case when the final outside dimensions are available even in the state where the thin film 6 has just beer separated as illustrated in FIG. 2(e), the present process may of course be omitted. Moreover, as compared with individual products that have been punched out as illustrated in FIG. 2(f), the product state with the thin film 6 as illustrated in FIG. 2(d) is greater in strength, and easily handled with an elongated shape. Therefore, the processes shown in FIGS. 2(e) and 2(f) may be carried out after the products have been sent to the user.

Figure 1:
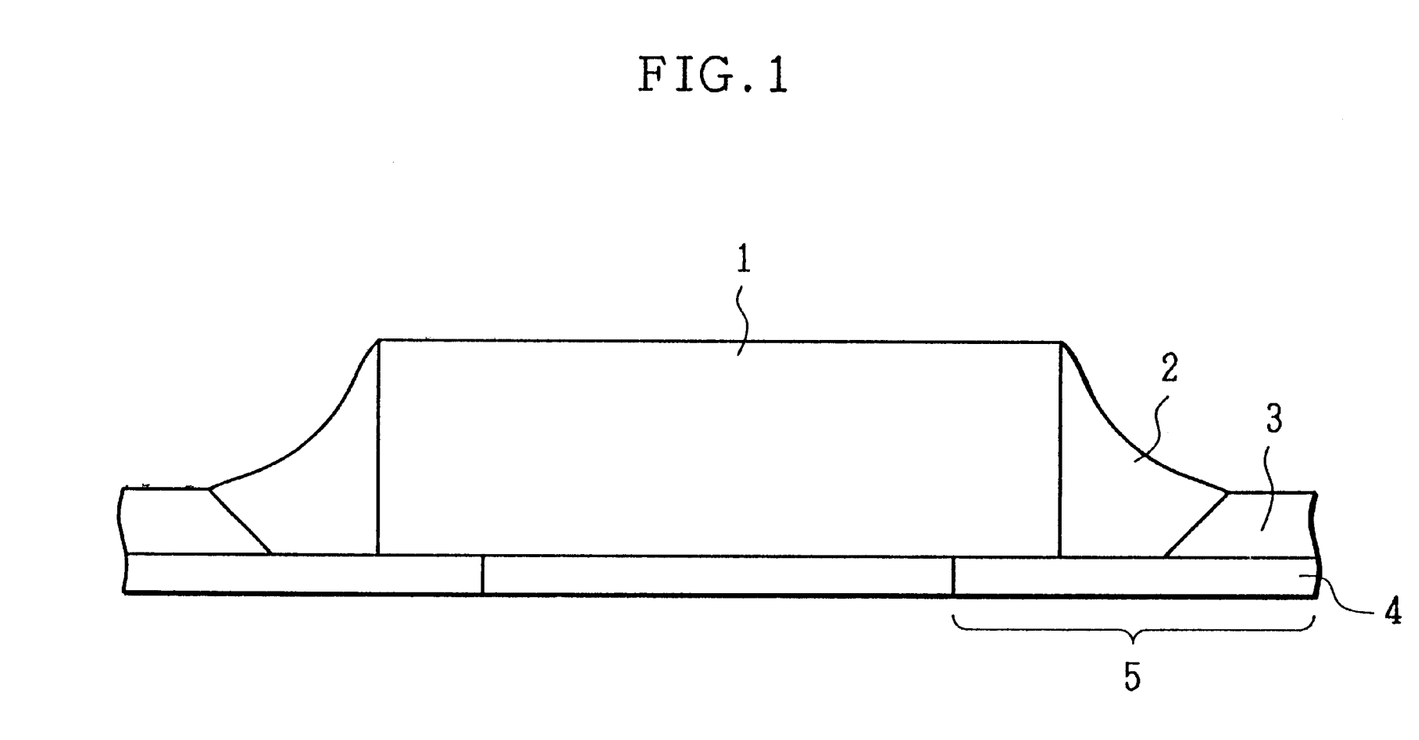
FIG. 1 is an explanatory draw ng that shows a cross-sectional construction of a COF package in accordance with one embodiment of the present invention.
Figure 4:
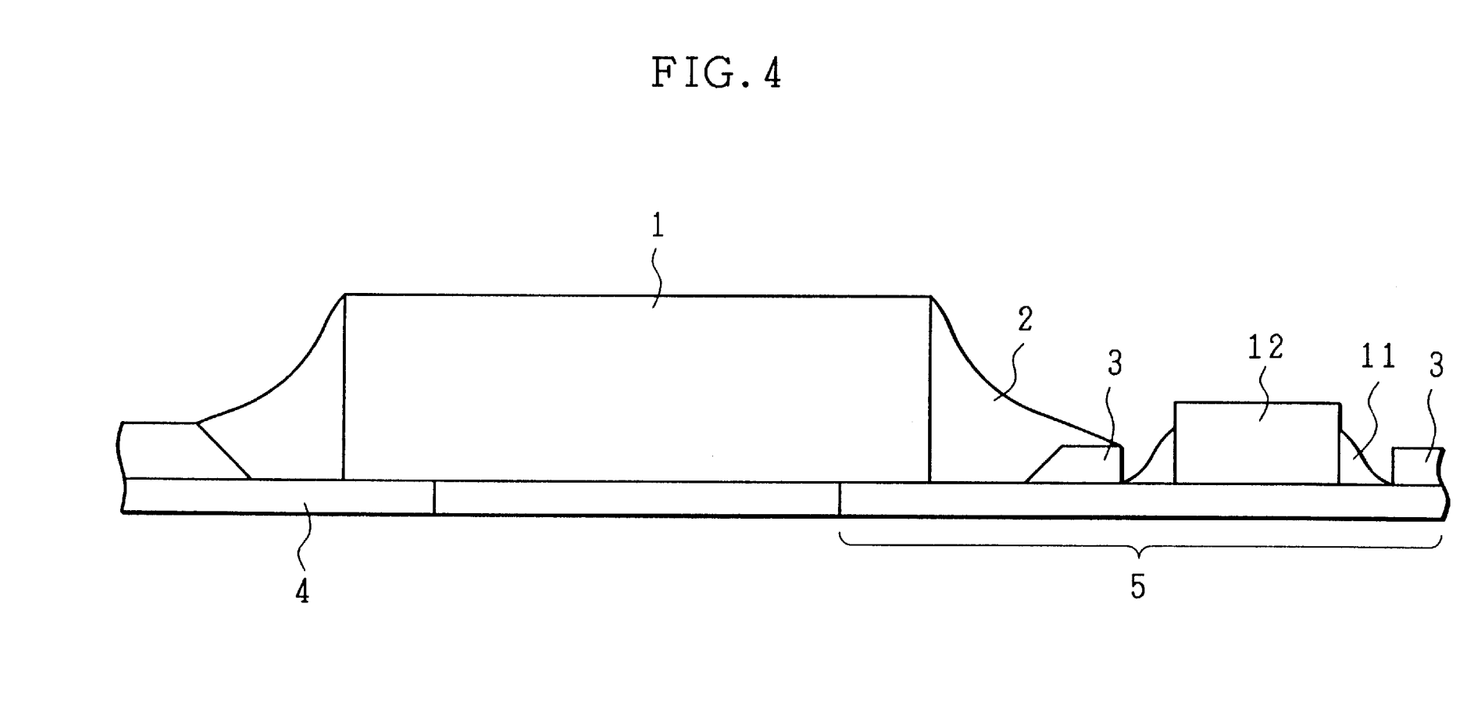
FIG. 4 is an explanatory drawing that shows a cross-sectional construction in the case when a part packaging type structure is applied to the package of the embodiment of the present invention.

FIG. 1 shows a cross-sectional view of the finished COF. Here, the connecting section between the IC chip 1 and the wiring pattern 4 is omitted from the Figure. In the same manner, FIG. 4 shows the cross-sectional view of the COF in which the part 12 is placed in the process shown in FIG. 2(d).

As indicated by FIG. 1, the thickness of the COF of the present invention is determined by a total value of the thickness of the IC chip 1 and the thickness of the connecting section to the wiring pattern 4. Therefore as compared with the conventional COF shown in FIG. 9, the COF of the present invention shown in FIG. 1 is allowed to make the package thinner by a thickness corresponding to the thin film 6. In this case, however, when the thickness of the part 12 is thicker than the IC chip 1, the thickness of the package is mainly determined by the thickness of the part 12.

Figure 10:
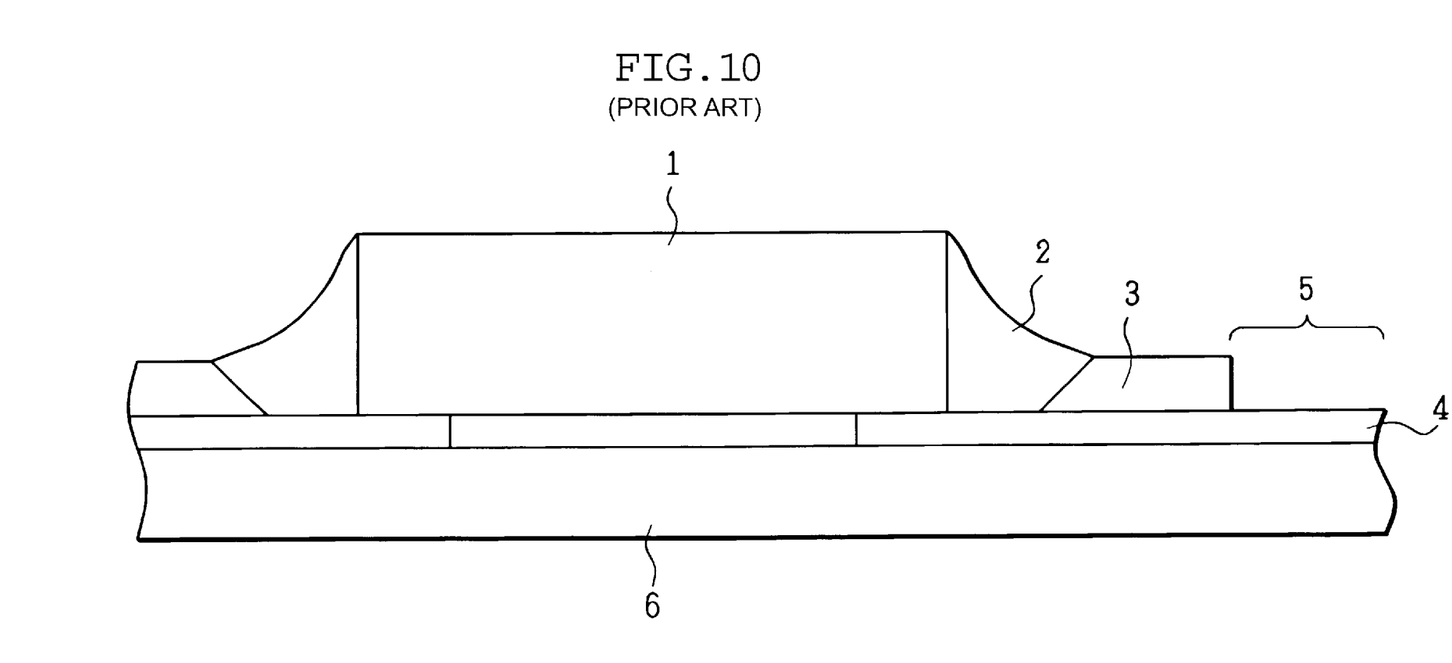
FIG. 10 is an explanatory drawing that shows a cross-sectional construction of a conventional COF package.

As illustrated in FIG. 9, in the conventional COF, the area in which the assembling members can be attached to the wiring pattern 4 is located on the side of the IC chip 1. In FIG. 10 which also shows a conventional COF, the above-mentioned area is shown as a possible packaging area 5 in a system corresponding to FIG. 1. In contrast, as illustrated in FIG. 1, in the COF of the present invention, the lower portion of the wiring pattern 4 used for connections to the IC chip 1 is exposed so that the exposed portion can be used for connections to external devices as the possible packaging area 5. Therefore, the IC chip 1 can be assembled onto an external device such as a liquid crystal display at the portion right under the IC ship 1. This arrangement makes it possible to improve the packaging efficiency, and also to reduce an erroneous transporting operation and mishandling that might occur in the packaging process.

Figure 3:
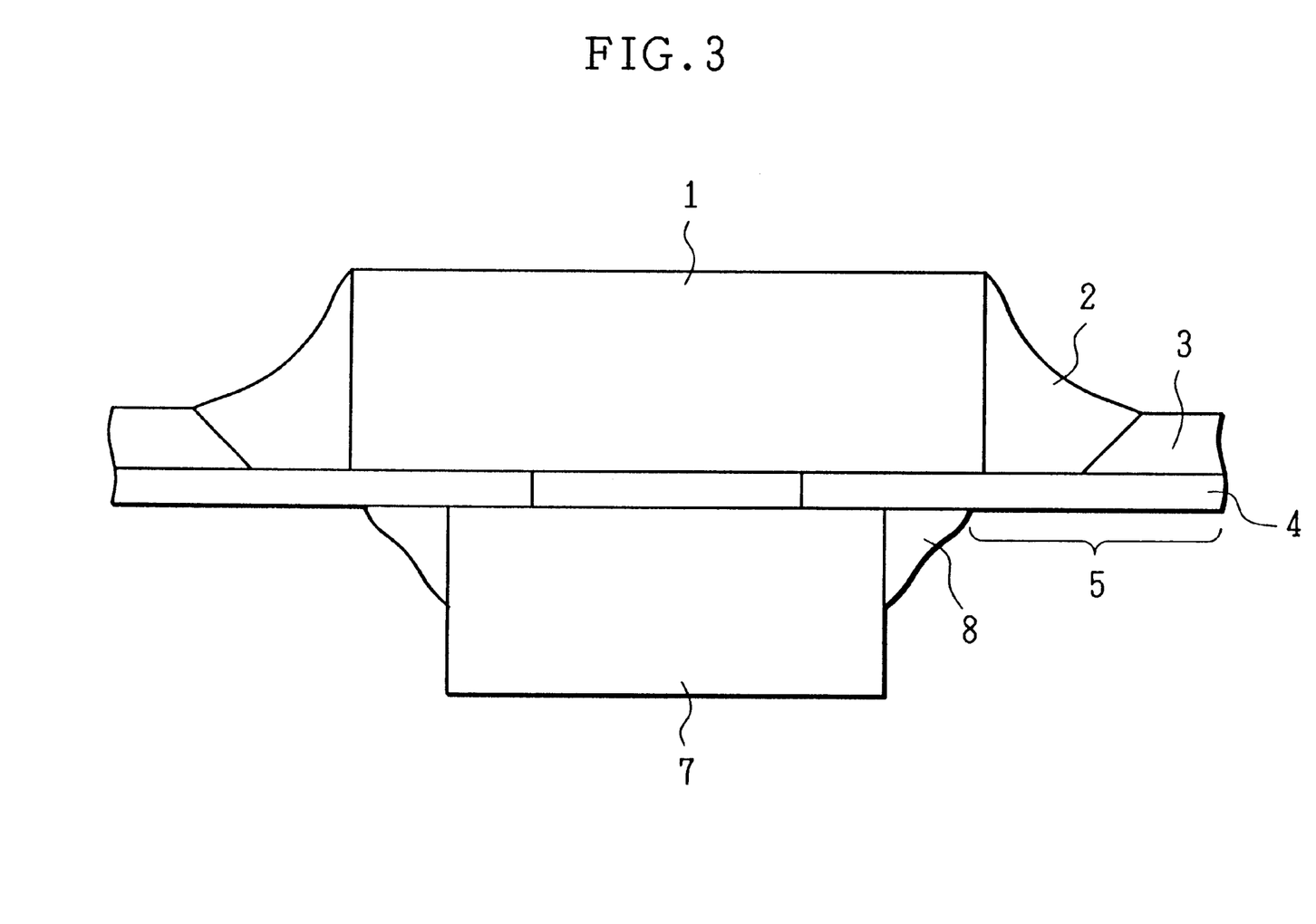
FIG. 3 is an explanatory drawing that shows a cross-sectional construction in the case when a stacked structure is applied to the package of the embodiment of the present invention.

Moreover, as illustrated in FIG. 3, another IC chip 7 may be packaged together with the IC chip 1 on both of the surfaces of the wiring pattern 4 by using the flip-chip assembling method. In other words, the IC chip 7 is joined with its face down onto the surface of the wiring pattern 4 opposite to the surface on which the IC chip 1 has been joined, so as to form a stacked structure. With this arrangement, even when a plurality of semiconductor elements, such as the IC chip 1 and the IC chip 7, are placed on a package, the area occupied by the semiconductor elements on the package can be minimized so that the packaging efficiency is further improved.

Moreover, as illustrated in FIG. 4, in the COF of the present embodiment, the tape carriers of the present invention can be assembled on both of the surfaces of the metal pattern; therefore, even when an area for accommodating a part 12 and solder 11 for fixing the part 12 is provided, it is possible to realize a comparatively small package. With this arrangement, it is possible to install one portion of the circuit of the power-supply main substrate connected to the package on the package side, and consequently to achieve the miniaturization of both of the package and the power-supply main substrate.

Furthermore, the COF of the present invention is provided with an area constituted by only the wiring pattern 4 and the cover coat 3 except the peripheral areas of the IC chip 1 and the part 12. Therefore, in the COF of the present invention, the area constituted by only the wiring pattern and the cover coat 3 can be used as a bendable area that is susceptible to only a small stress.

Accordingly, it is preferable for the tape carrier to have an area constituted by only the metal pattern and the protective layer stacked on the metal pattern. In most cases, the tape carrier of the present invention is joined to an external device in its bent state. Therefore, the above-mentioned tape carrier is provided with the area constituted by only the metal pattern and the protective layer laminated on the metal pattern, that is, an area having a minimum structure including the metal pattern serving as connection wiring and the protective layer for protecting the metal pattern against electricity and external stress; thus, this area can be used as a bendable area that is susceptible to only a small stress. With this arrangement, when the package is bent and joined to an external device, it is possible to effectively reduce insufficiently joined products due to a bending stress exerted on the package, and also to achieve a small joining area to the external connecting terminals.

Moreover, it is preferable to apply plating processes to both of the surfaces of the metal pattern of the tape carrier. The metal pattern contains an area connected to external and internal devices, and by applying the plating processes on both of the surfaces of the metal pattern, the connecting area of the metal pattern is also allowed to have a plated state on both of its surfaces. Therefore, it is possible to connect semiconductor elements and circuit parts to any of the surfaces of the connecting area in a desired, stable state. Thus, in the case when circuit parts including semiconductor elements are assembled on both of the surfaces of the package, it becomes possible to carry out a parts connecting process with high reliability on both of the surfaces of the package. Moreover, since the plating processes can be carried out on all the surfaces of the metal film prior to the formation of the metal pattern, it is possible to simplify the plating processes, and also reduce contamination on the plated layers.

Moreover, the thickness of the metal pattern is preferably set in the range of 5 to 35 $\mu$cm. Since the metal pattern forms the main component of the tape carrier, the above-mentioned limitation to the thickness of the metal pattern makes the tape carrier sufficiently thin while maintaining its flexibility and to have a structure that is easily bent. For this reason, it is possible to minimize a stress exerted on the tape carrier even when it is connected to an external device in a bent state. Consequently it becomes possible to reduce the occurrence of disconnection by improving the joining stability of the tape carrier to an external device.

Moreover, the above-mentioned tape carrier is preferably provided with a part-placing area. For example, the part-placing area is formed between the semiconductor element and the metal pattern so that parts such as resistors and capacitors can be assembled on the tape carrier. Since the tape carrier of the present invention enables assembling processes on both of the surfaces of the metal pattern, it is possible to achieve a comparatively small package even when the part-placing area is formed thereon. With this arrangement, it is possible to install one portion of the circuit of the power-supply main substrate connected to the package on the package side, and consequently to achieve the miniaturization of both of the package and the power-supply main substrate.

Moreover, the tape carrier is preferably provided with a base film layer that is easily separated. The application of the easily-separable base film layer makes it possible to transport and handle the tape carrier in a high-strength state with the base film layer, and the base film layer is then separated therefrom so that circuit members are attached to the metal pattern or connection is made to an external device.

Thus, it is possible to achieve easy handling and transportation of the tape carrier. Moreover, in the conventional construction, the base film is contained in the final package; therefore, it is necessary to select as a base film extremely limited materials that are highly reliable with high bending characteristic, etc. In contrast, in the present invention, since the base film is finally separated and removed, even generally-used materials can be applied, thereby making it possible to cut costs.

Moreover, in the above-mentioned tape carrier, it is preferable to assemble semiconductor elements on both of the surfaces of the metal pattern by using the flip-chip assembling method. Here, in the case when semiconductor elements are assembled on both of the surfaces of the metal pattern by using the flip-chip assembling method, a stacked structure is formed with another semiconductor element being joined with its face down to the surface of the metal pattern opposite to the surface to which one semiconductor element is joined. For this reason, even when a plurality of semiconductor elements are assembled on the carrier, the area occupied by the semiconductor elements on the package can be reduced, thereby making it possible to improve the assembling efficiency. With this arrangement, even when a plurality of semiconductor elements are assembled, it is possible to miniaturize the package, and consequently to cut costs.

The package manufacturing method of the present invention is characterized by including a process for dividing the above-mentioned tape carrier into individual pieces. For example, the tape carrier is subjected to a punch-out process, that is, the individually-dividing process, so as to form packages. Consequently, the resulting packages are allowed to have the technical effects inherent to the above-mentioned tape carrier.

The manufacturing method of the tape carrier of the present invention is characterized by including the steps of: obtaining a pattern film having a predetermined metal pattern by patterning metal foil that has been bonded to or stacked on a base film, and separating the base film from the pattern film.

In accordance with the above-mentioned invention, a metal pattern used for connections to connection terminals of a semiconductor element and for connections to an external device is formed on a base film, and the base film is separated from the metal pattern. Therefore, as compared with the conventional tape carrier, the tape carrier, manufactured through the above-mentioned method, makes it possible to greatly reduce a stress exerted thereon when the tape carrier is bent since the base film has been removed. Thus, in the case when a package obtained by punching out the tape carrier is connected to an external device in a bent state, that is, for example, in the case when the package is connected to connection terminals of a liquid crystal device in a bent state, it is possible to reduce the occurrence of disconnection due to a bending stress exerted on the package. Since the bending stress of the package is small, it is possible to minimize the joining area to the connection terminals of a liquid crystal panel, etc., and consequently to further miniaturize the package.

Moreover, in the tape carrier manufactured by the above-mentioned method, even in the case when it has a structure which entirely covers one of the surfaces of the semiconductor element without any device hole, since the metal pattern is exposed to the surface opposite to the surface to which the semiconductor element is connected, a circuit element can be connected to the surface opposite to the surface to which the semiconductor element is connected, and it is possible to form a package circuit by using both of the surfaces of the tape carrier.

With this arrangement, as compared with the conventional structure, it is possible to miniaturize the package, and also to cut costs. Moreover, with respect to a package having a predetermined size, it is possible to provide more margins in designing as compared with the conventional arrangement; thus, it becomes possible to widen the intervals between the parts, and consequently to revise the parts more easily.

Moreover, in the above-mentioned manufacturing method, the base film layer is provided so that it is possible to transport and handle the carrier in a high-strength state, and the base film layer is then separated therefrom so that circuit members are attached to the metal pattern or connection is made to an external device. Thus, it is possible to achieve easy handling and transportation of the tape carrier.

Moreover, in the conventional construction, the base film is contained in the final package; therefore, it is necessary to select as a base film extremely limited materials that are highly reliable with high bending characteristic, etc. In contrast, in the present invention, since the base film is finally separated and removed, even generally-used materials can be applied, thereby making it possible to cut costs.

Moreover, in the above-mentioned manufacturing method, it is preferable to provide such a surface resistivity that no current leakage arises at the time of inspection of the electrical characteristics of the metal pattern. In this manner, the application of such a material having a high electric resistivity as the base film makes the conductivity of the base film portion become smaller so as to be negligible in comparison with the wiring pattern portion, etc. Therefore, even in the case when an inspection process for confirming the electrical and mechanical continuities between the wiring pattern and the semiconductor element, etc., and for confirming the insulating property between the independent wiring patterns are placed before the separation of the base film, it is possible to avoid erroneous judgments due to current leakage from the base film portion, and consequently to carry out the inspection positively and more easily.

The tape carrier of the present invention, which is a tape carrier having a wiring pattern to be connected to connecting terminals of a semiconductor element and an external device, is characterized in that the wiring pattern is exposed to the surface on the side opposite to the surface to which the semiconductor element is connected.

With this arrangement, it is possible to connect a circuit element including a semiconductor element to the wiring pattern exposed to the surface on the side opposite to the surface to which the semiconductor element is connected, of the upper and lower two surfaces that the tape carrier has.

In accordance with the above-mentioned invention, the metal pattern is exposed to the surface on the side opposite to the surface to which the semiconductor element is connected; therefore, a circuit element can be connected also to this surface, and a package circuit is constituted by using both of the surfaces of the tape carrier. With this arrangement, as compared with the conventional structure, it is possible to miniaturize the package, and also to cut costs. Moreover, with respect to a package having a predetermined size, it is possible to provide more margins in designing as compared with the conventional arrangement; thus, it becomes possible to widen the intervals between the parts, and consequently to revise the parts more easily.

Moreover, since the tape carrier of the present invention has no base film, the stress exerted at the time of bending of the tape carrier can be minimized by a value corresponding to the stress exerted due to the base film. Thus, in the case when a package is connected to an external device in a bent state, that is, for example, in the case when the package is connected to connection terminals of a liquid crystal device in a bent state, it is possible to reduce the occurrence of disconnection due to a bending stress exerted on the package. Since the bending stress of the package is small, it is possible to minimize the joining area to the connection terminals of a liquid crystal panel, etc., and consequently to further miniaturize the package.

The tape carrier of the present invention, which is a tape carrier having exposed areas on both of the surfaces thereof and a wiring pattern to be connected to connection terminals of a semiconductor element and an external device, is characterized in that one of its side faces has a continuous flat face.

With the above-mentioned structure, of the upper and lower two faces of the tape carrier, a circuit element containing a semiconductor element can be connected to the wiring pattern exposed to the surface opposite to the face to which the semiconductor element is connected.

Therefore, in accordance with the present invention, since the metal pattern is also exposed to the surface on the side opposite to the surface to which the semiconductor element is connected, a circuit element can be connected to this surface; thus, a package circuit can be constructed by using both of the surfaces of the tape carrier. With this arrangement, as compared with the conventional structure, it is possible to miniaturize the package, and also to cut costs. Moreover, with respect to a package having a predetermined size, it is possible to provide more margins in designing as compared with the conventional arrangement; thus, it becomes possible to widen the intervals between the parts, and consequently to revise the parts more easily.

Since the base carrier of the present invention has no base film, the stress exerted at the time of bending of the tape carrier can be minimized by a value corresponding to the stress that would be exerted due to the base film. Thus, in the case when a package is connected to an external device in a bent state, that is, for example, in the case when the package is connected to connection terminals of a liquid crystal device in a bent state, it is possible to reduce the occurrence of disconnection due to a bending stress exerted on the package. Since the bending stress of the package is small, it is possible to minimize the joining area to the connection terminals of a liquid crystal panel, etc., and consequently to further miniaturize the package.

The manufacturing method of the tape carrier of the present invention is provided with the steps of: providing a patterned film having a predetermined wiring pattern by patterning a conductor that has been bonded or stacked on a base film; and separating the base film from the patterned film.

In accordance with the above-mentioned invention, a metal pattern used for connections to connection terminals of a semiconductor element and for connections to an external device is formed on a base film, and the base film is separated from the metal pattern. Therefore, as compared with the conventional tape carrier, the tape carrier, manufactured through the above-mentioned method, makes it possible to greatly reduce a stress exerted thereon when the tape carrier is bent since the base film has been removed. Thus, in the case when a package obtained by punching out the tape carrier is connected to an external device in a bent state, that is, for example, in the case when the package is connected to connection terminals of a liquid crystal device in a bent state, it is possible to reduce the occurrence of disconnection due to a bending stress exerted on the package. Since the bending stress of the package is small, it is possible to minimize the joining area to the connection terminals of a liquid crystal panel, etc., and consequently to further miniaturize the package.

Moreover, in the tape carrier manufactured by the above-mentioned method, even in the case when it has a structure which entirely covers one of the surfaces of the semiconductor element without any device hole, since the metal pattern is exposed to the surface opposite to the surface to which the semiconductor element is connected, a circuit element can be connected to the surface opposite to the surface to which the semiconductor element is connected, and it is possible to form a package circuit by using both of the surfaces of the tape carrier.

With this arrangement, as compared with the conventional structure, it is possible to miniaturize the package easily, and also to cut costs. Moreover, with respect to a package having a predetermined size, it is possible to provide more margins in designing as compared with the conventional arrangement; thus, it becomes possible to widen the intervals between the parts, and consequently to revise the parts more easily.

Moreover, in the above-mentioned manufacturing method, the base film is provided so that it is possible to transport and handle the carrier in a high-strength state, and the base film layer is then separated therefrom so that circuit members are attached to the metal pattern or connection is made to an external device. Thus, it is possible to achieve easy handling and transportation of the tape carrier.

Moreover, in the conventional construction, the base film is contained in the final package; therefore, it is necessary to select as a base film extremely limited materials that are highly reliable with high bending characteristic, etc. In contrast, in the present invention, since the base film is finally separated and removed, even generally-used materials can be applied, thereby making it possible to cut costs.

The above-mentioned manufacturing method is preferably provided with a process for joining the base film to the conductor, or for stacking the base film thereon, so that it has a peel strength in the range of 50 to 200 g/cm$^2$ in a peeling strength test for measuring the peel strength.

With this arrangement, since the base film and the conductor are separated from each other easily so that the wiring pattern is exposed smoothly. Here, when the peel strength is greater than the above-mentioned range, it becomes difficult to easily carry out the separation between the tape carrier and the base film. Consequently, it is not possible to carry out the manufacturing process of the tape carrier smoothly, and the application of an excessive force to the tape carrier for the separation might separate even a portion of a member required for the tape carrier. In contrast, the peel strength smaller than the above-mentioned range might cause a deviation between the tape carrier and the base film during the production of the tape carrier, resulting in a problem of defective products.

In the present invention, since the base film is bonded thereto, or stacked thereon, with a peel strength in the range of 50 to 200 g/cm$^2$, it becomes possible to prevent the above-mentioned problems, and consequently to carry out the manufacturing process smoothly.

The above-mentioned manufacturing method is preferably provided with the steps of: preparing a material that is selectively etched, as the base film, and removing the base film through an etching process.

Thus, it is possible to easily carry out the separation between the base film and the conductor. Moreover, this arrangement eliminates the necessity of taking it into consideration the peel strength in the case when the base film is bonded to the conductor, or stacked on the conductor; therefore, it is possible to solve the problems of defective products occurring during the separation process.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A tape carrier, which entirely covers one surface of a semiconductor element, comprising:
   a metal pattern which is connected to a connection terminal of the semiconductor element and an external device, and
   a protective layer on a portion of the metal pattern for protecting the metal pattern, wherein the metal pattern, is exposed solely at a bottom surface opposite to the surface to which the semiconductor element is connected.

2. The tape carrier as defined in claim 1, including an area, constituted solely by the metal pattern and said protective layer stacked on the metal pattern.

3. A tape carrier as defined in claim 2, wherein said area defines a bendable area.

4. The tape carrier as defined in claim 1, wherein plating is applied to both of the surfaces of the metal pattern.

5. The tape carrier as defined in claim 1, wherein the metal pattern has a thickness of 5 to 35 $\mu$m.

6. The tape carrier as defined in claim 1, further comprising a part-placing area.

7. The tape carrier as defined in claim 1, wherein semiconductor elements are assembled on both of the surfaces of the metal pattern by a flip-chip assembling method.

8. A manufacturing method of a package comprising the step of processing the tape carrier of claim 1 into individual chips.

9. A tape carrier as defined in claim 1, wherein a thickness of the tape carrier is defined by a total value of a thickness of-the semiconductor element, a thickness of said connection terminal and a thickness of said metal pattern.

10. A tape carrier as defined in claim 1, further comprising a second semiconductor element connected to the bottom surface of the metal pattern whereby both top and bottom surfaces of the tape carrier are used.

11. The tape carrier as in claim 1 including circuit parts assembled on both of the surfaces of the metal pattern.

12. A tape carrier, which entirely covers one surface of a semiconductor element, comprising:

a metal pattern connected to a connection terminal of the semiconductor element and an external device, wherein the metal pattern, is exposed at a bottom surface opposite to the surface to which the semiconductor element is connected, wherein a base film layer which is easily separable is detachably bonded to said bottom surface.

13. A tape carrier as defined in claim 12, further comprising a protective layer disposed on a portion of the metal pattern for protecting the metal pattern.

14. A tape carrier, which is a freely bendable tape carrier, comprising:

a wiring pattern which is connected to a connection terminal of the a semiconductor element and an external device, and a protective layer on a portion of the wiring pattern for protecting the wiring pattern, wherein the wiring pattern is exposed solely at a bottom surface opposite to the surface to which the semiconductor element is connected.

15. A tape carrier as defined in claim 14, wherein a thickness of the tape carrier is defined by a total value of a thickness of the semiconductor element, a thickness of said connection terminal and thickness of said wiring pattern.

16. The tape carrier as in claim 14 including circuit parts assembled on both of the surfaces of the wiring pattern.

17. A tape carrier, comprising:

a wiring pattern which is connected to a connection terminal of a semiconductor element and an external device, a protective layer disposed on a portion of the wiring pattern for protecting the metal pattern; and a bottom surface opposite to the surface to which the semiconductor element is connected wherein aid bottom surface is a continuous plane, wherein the wiring pattern is exposed at said bottom surface.

18. A tape carrier as defined in claim 17, wherein a thickness of the tape carrier is defined by a total value of a thickness of the semiconductor element, a thickness of said connection terminal and a thickness of said wiring pattern.

19. A tape carrier as defined in claim 17, further comprising a second semiconductor element connected to the bottom surface of the wiring pattern whereby both top and bottom surfaces of the tape carrier are used.

20. The tape carrier as in claim 17 including circuit parts assembled on both of the surfaces of the wiring pattern.

* * * * *